(12) United States Patent
Suma Vinay et al.

(10) Patent No.: US 10,348,298 B2
(45) Date of Patent: Jul. 9, 2019

(54) REPEATER FOR AN OPEN-DRAIN COMMUNICATION SYSTEM USING A CURRENT DETECTOR AND A CONTROL LOGIC CIRCUIT

(71) Applicant: Texas Instruments Incorporated, Dallas, TX (US)

(72) Inventors: Vikas Suma Vinay, Dallas, TX (US); Tatsuyuki Nihei, Wylie, TX (US); Christopher Lewis Kraft, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/875,573

(22) Filed: Jan. 19, 2018

(65) Prior Publication Data

US 2018/0323785 A1 Nov. 8, 2018

Related U.S. Application Data

(60) Provisional application No. 62/500,818, filed on May 3, 2017, provisional application No. 62/612,018, filed on Dec. 29, 2017.

(51) Int. Cl.
*G06F 13/42* (2006.01)
*H03K 19/00* (2006.01)
*H03K 19/0185* (2006.01)
*G01R 31/30* (2006.01)

(52) U.S. Cl.
CPC ..... *H03K 19/0008* (2013.01); *G01R 31/3004* (2013.01); *H03K 19/0185* (2013.01); *G06F 13/4282* (2013.01); *G06F 2213/0016* (2013.01)

(58) Field of Classification Search
CPC ............ H03K 19/0008; H03K 19/0185; G06F 13/4282; G06F 2213/0016
See application file for complete search history.

(56) References Cited

U.S. PATENT DOCUMENTS

| | | | | |
|---|---|---|---|---|
| 5,974,527 A | * | 10/1999 | Ko | G11C 7/1078 365/63 |
| 6,362,654 B1 | * | 3/2002 | Anderson | G06F 13/4045 326/21 |
| 7,822,890 B2 | | 10/2010 | Hwang et al. | |
| 2008/0001625 A1 | * | 1/2008 | Hwang | H03K 19/0185 326/31 |

(Continued)

FOREIGN PATENT DOCUMENTS

EP 2712083 B1 3/2014

*Primary Examiner* — Jason Crawford
(74) *Attorney, Agent, or Firm* — Ebby Abraham; Charles A. Brill; Frank D. Cimino

(57) ABSTRACT

This disclosure generally relates to repeaters, and, in particular, repeaters for open-drain systems. In one embodiment, an apparatus comprises a first port, a second port, a current detector, a transistor, and a control logic circuit. A current detector input of the current detector is coupled to the first port. A transistor channel electrode of the transistor is coupled to the second port. A control logic circuit input of the control logic circuit is coupled to the current detector output, and a control logic circuit output of the control logic circuit is coupled to a transistor control electrode of the transistor.

12 Claims, 5 Drawing Sheets

(56) References Cited

U.S. PATENT DOCUMENTS

| | | | |
|---|---|---|---|
| 2008/0278122 A1* | 11/2008 | Chi | H03K 19/0008 323/220 |
| 2010/0123479 A1* | 5/2010 | Osaka | H03K 17/6871 326/80 |
| 2013/0043937 A1* | 2/2013 | Lloyd | H03F 1/0283 327/540 |
| 2014/0070781 A1 | 3/2014 | Yanagida | |
| 2017/0063074 A1* | 3/2017 | Yasusaka | H01L 27/0255 |

* cited by examiner

| LOGIC LEVEL OF A SIDE PORT | LOGIC LEVEL OF B SIDE PORT | CURRENT DETECTION OUTPUT B SIDE | ENABLE A SIDE PULL DOWN RESISTOR | ENABLE B SIDE PULL DOWN RESISTOR |
|---|---|---|---|---|
| 1 | 1 | 1 | 0 | 0 |
| 1 | 1 | 0 | 0 | 0 |
| 1 | 0 | 1 | 1 | 0 |
| 1 | 0 | 0 | 0 | 0 |
| 0 | 1 | 1 | 0 | 1 |
| 0 | 1 | 0 | 1 | 1 |
| 0 | 0 | 1 | 0 | 1 |
| 0 | 0 | 0 | 0 | 1 |

FIG. 4

REPEATER FOR AN OPEN-DRAIN COMMUNICATION SYSTEM USING A CURRENT DETECTOR AND A CONTROL LOGIC CIRCUIT

PRIORITY

This application claims the benefit, under 35 U.S.C. § 119(e), of U.S. Provisional Patent Application No. 62/612,018, filed Dec. 29, 2017, which claims the benefit of U.S. Provisional Patent Application No. 62/500,818, filed May 3, 2017, the entireties of which are incorporated herein by reference.

TECHNICAL FIELD

This disclosure generally relates to repeaters, and, in particular, repeaters for open-drain systems.

BACKGROUND

Repeaters are very common in systems where multiple devices share a common bus for communication. Moreover, standards, such as Inter-Integrated Circuit (I2C) and System Management Bus (SMBUS) protocol, require the communication over open-drain lines. However, due to the bi-directional nature of communicating between devices, detecting which device is transmitting/receiving data is challenging for repeaters.

Conventional approaches to repeaters in open-drain systems involve either static offset buffers or complicated power hungry circuitry. Static offset buffers are problematic, because static offset buffers introduce a static offset that can be problematic for downstream devices to see a proper output low level. In addition, many repeaters use pull-up resistors to detect the transmission and/or reception of data, but these pull-up resistors can be large in size and are costly. In addition to these problems, some repeaters are not capable of handling higher speed communications.

SUMMARY OF PARTICULAR EMBODIMENTS

In accordance with this disclosure, an apparatus comprises a first port, a second port, a current detector, a transistor, and a control logic circuit. A current detector input of the current detector is coupled to the first port. A transistor channel electrode of the transistor is coupled to the second port. A control logic circuit input of the control logic circuit is coupled to the current detector output, and a control logic circuit output of the control logic circuit is coupled to a transistor control electrode of the transistor.

BRIEF DESCRIPTION OF THE DRAWINGS

FIG. 4 is an exemplary binary logic table for implementation in a control logic circuit in certain embodiments.

DESCRIPTION OF EXAMPLE EMBODIMENTS

Figure 1:
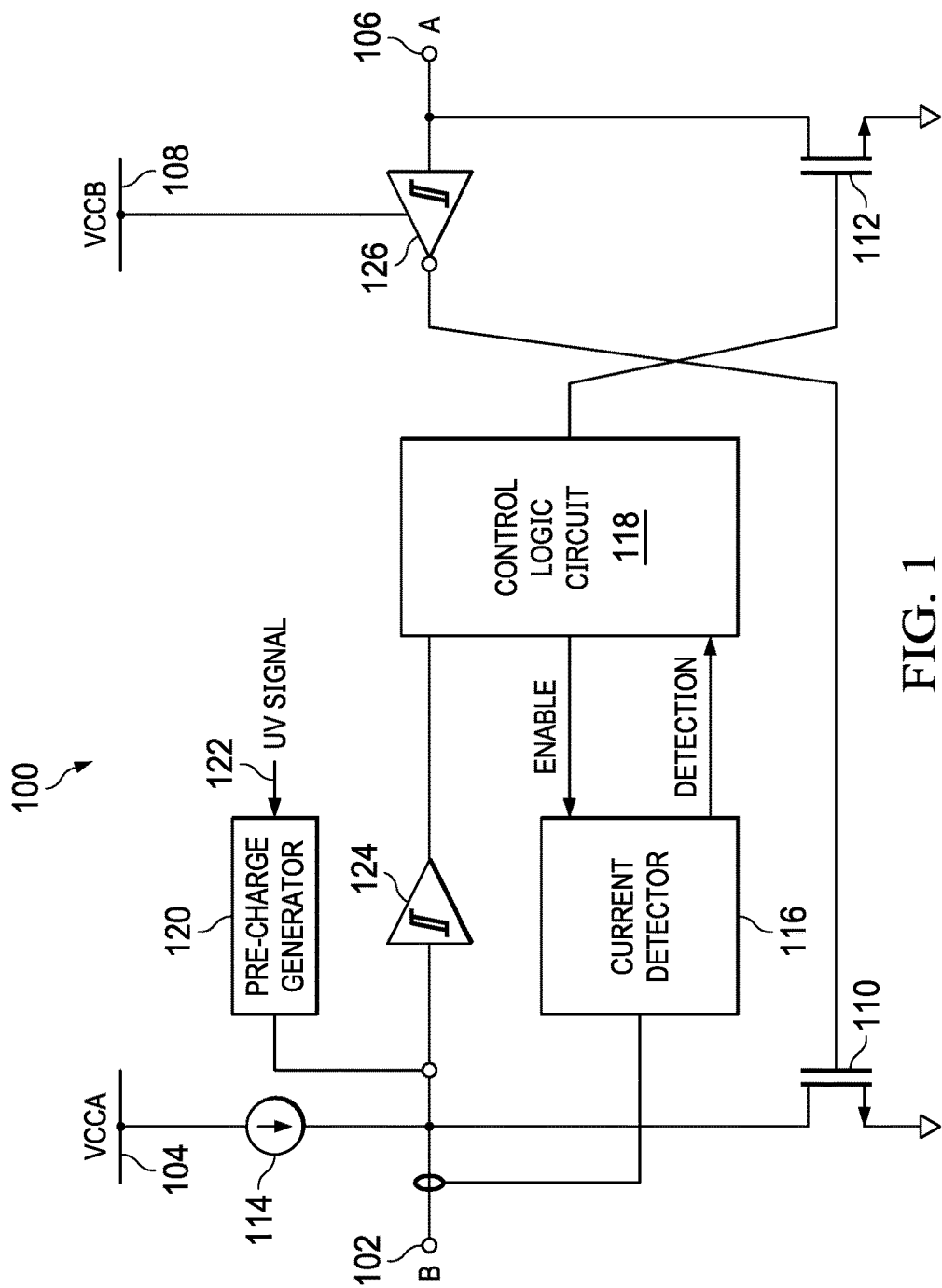
FIG. 1 is an exemplary bit-cell architecture for a repeater.

This disclosure describes techniques for repeating a signal from a first port of a repeater to a second port of the repeater. In one embodiment, an apparatus comprises a first port, a second port, a current detector, a transistor, and a control logic circuit. A current detector input of the current detector is coupled to the first port. A transistor channel electrode of the transistor is coupled to the second port. A control logic circuit input of the control logic circuit is coupled to the current detector output, and a control logic circuit output of the control logic circuit is coupled to a transistor control electrode of the transistor.

The disclosure may present several technical advantages. Technical advantages of the disclosed repeater may include a smaller footprint and reduction in cost for the repeater as external pull-up resistors may be eliminated. Another technical advantage of the disclosed repeater may include improved performance of the repeater by the elimination of a static voltage offset. Moreover, an additional technical advantage of the disclosed repeater may include eliminating the need for a power sequencing for the repeater. In addition, another technical advantage of the disclosed repeater is the repeater's support of high frequency communication speeds, such as I2C standard speed (100 kHz), I2C fast mode (400 kHz), and I2C fast-mode plus (1 MHz). Moreover, an additional technical advantage of the disclosed repeater may include improved signal integrity and a shorter rise-time of the repeated signal.

Other technical advantages of the present disclosure will be readily apparent to one skilled in the art from the following figures, descriptions, and claims. Moreover, while specific advantages have been enumerated above, various embodiments may include all, some, or none of the enumerated advantages.

A repeater may be used to help overcome losses in systems or to help mask loading effects in systems where electrical signals can degrade and lose their quality. While discussed as a repeater, the disclosure contemplates the repeater may also include a buffer and/or level shifter. Repeaters have the ability to receive a signal at their inputs, buffer the signal with some delay, and then resend the signal out on its way. A repeater is especially useful when signals must traverse long cables, which can be susceptible to high amounts of loss, as the repeater can help the system overcome the effects of the cable and maintain adequate signaling performance. Moreover, a repeater may provide bidirectional level shifting (up-translation and down-translation) between low voltages and high voltages.

The repeater in this disclosure is applicable to open-drain systems. Components in open-drain systems can drive a communication bus low or leave the communication bus open. Typically, a resistor (e.g., a pull-up resistor) pulls the communication bus up to a voltage if no device is actively pulling down on the bus. This allows for features like the concurrent operation of more than one master device or the stretching of the communication bus where slaves can delay communication by holding down the communication bus. Open-drain systems may also be known as open collectors in integrated circuits.

An exemplary open-drain protocol is Inter-Integrated Circuit (I2C) and System Management Bus (SMBUS). I2C is a communication protocol that allows multiple devices to communicate with each other. I2C can support a multi-master, multi-slave system, allowing more than one device to communicate with all devices on the bus. SMBus is derived from the I2C protocol. I2C and SMBus use only two bidirectional open-drain lines: Serial Data Line (SDA) and Serial Clock Line (SCL). SDA is the data signal, and SCL is the clock signal. SCL is typically generated by a master device. Devices in an I2C system use the SDA and SCL to communicate with the other devices.

Moreover, these communications can occur at a specified frequency. For example, I2C provides for a standard speed (100 kHz), a fast mode (400 kHz), and a fast-mode plus (1 MHz).

FIG. 1 is an exemplary bit-cell architecture for repeater 100. Repeater 100 includes first port voltage supply 104, second port voltage supply 108, first transistor 110, second transistor 112, current source 114, current detector 116, control logic circuit 118, pre-charge current generator 120, first Schmitt trigger 124, and second Schmitt trigger 126. Repeater 100 also includes first port 102 that may be connected to an external device (e.g., a master device, slave device, or an additional repeater) and second port 106 that may be connected to another external device (e.g., a master device, slave device, or an additional repeater). In certain embodiments, first port 102 may be referred to as the B-side and second port 106 may be referred to as the A-side.

The repeater may contain first port 102 and second port 106. In certain embodiments, first port 102 is coupled to a slave device (e.g., a peripheral device) and second port 106 is coupled to a master device (e.g., a processor). However, first port 102 may be coupled to one or more devices and second port 106 may be coupled to one or more devices.

First port 102 may be coupled to a channel electrode (e.g., a drain) of first transistor 110 and current source 114. Current source 114 may provide a stable, known source of current (for example, current source 114 may be a constant current source) or may provide a variable current source. In some examples, the drain of transistor 110 may be directly coupled to the input port of first Schmitt trigger 124 (or the input of another type of voltage detector) without any intervening components, or in some cases, at least without any intervening resistors coupled between the drain of the transistor and the input of first Schmitt trigger 124.

Second port 106 may also be coupled to a channel electrode (e.g., a drain) of second transistor 112. In certain embodiments, control logic circuit 118 incorporates second Schmitt trigger 126, and, in this embodiment, control logic circuit 118 may determine whether the communication bus at second port 106 is pulled down. By adjusting the voltage at the control electrode of second transistor 112, second port 106 may be pulled down by second transistor 112.

In certain embodiments, each device (e.g., device connected to first port 102 and device connected to second port 106) transmitting and/or receiving data to or from the bus may have an input/output terminal coupled to a line of the data bus (e.g., first port 102 and/or second port 106). First port 102 and second port 106 may be coupled to a channel electrode (e.g., drain or collector) of an active pull-down transistor (hereinafter referred to as a transistor), such as first transistor 110 and second transistor 112. The transistor may have a second channel electrode (e.g., source or emitter) grounded and the control electrode coupled to a digital control signal. The transistor may have a threshold voltage between logic "low" and logic "high" voltages (e.g., midway between) so as to differentiate between a received low state and high state from the digital control signal.

First port voltage supply 104 and second port voltage supply 108 may be power supply pins connected to the repeater. First port voltage supply 104 and second port voltage supply 108 may connect to one or more power rails of the circuit. First port voltage supply 104 may be connected to the same power rail as second port voltage supply 108, or first port voltage supply 104 may be connected to a different power rail than second port voltage supply 108. In certain embodiments, the voltage at first port voltage supply 104 is different than the voltage at second port voltage supply 108.

Current detector 116 may be coupled to current source 114 and first port 102. In a certain embodiment, current source 114 is coupled to the drain of first transistor 110 at a first node, and current detector 116 is coupled to a current path that is formed between the first port and the first node. Because the pull-up current is a known value through current source 114, current detector 116 may be able to determine how much current is flowing through first port 102. Current detector 116 may detect the current flowing through first port 102, current flowing to first port 102, current flowing towards the first node (i.e., the node connecting current source 114 with the drain of first transistor 110), a comparison of the current in either direction, no current, or a comparison of the current (in one direction or either direction) against a predetermined threshold. By detecting the current between first port 102 and first node, the repeater is able to determine whether any devices at first port 102 and/or second port 106 are in control of the communication bus and may be communicating information. In certain embodiments, current detector 116 determines how much current is flowing between first port 102 and first node to determine whether any devices at first port 102 are in control of the communication bus.

For example, if devices at first port 102 and second port 106 are inactive or not in control of the communication bus, then first port 102 and second port 106 may leave the communication bus open (e.g., transistors 110 and 112 may be turned off to cause first and second ports 102 and 106 to operate in a floating state or a high impedance state).

In the illustrated embodiment in FIG. 1, second Schmitt trigger 126 may force first transistor 110 to pull down the communication bus at first port 102 in response to second port 106 transitioning from a high logic state to a low logic state. In addition, current detector 116 may also determine whether first port 102 is active by determining that the device from first port 102 is pulling current from current source 114. Consequently, control logic circuit 118 may receive the detected current from current detector 116, and, based on the logic in control logic circuit 118, may cause second transistor 112 to either pull the communication bus at second port 106 down or leave the communication bus at second port 106 open.

As seen in the example, a first input of control logic circuit 118 may be coupled to an output of current detector 116. Using the detected current from current detector 116, control logic circuit 118 may control the control electrode of second transistor 112. For example, control logic circuit 118 may include Boolean circuitry to implement combinational logic. As a further example, control logic circuit 118 may implement the following logic table to determine how to control the control electrode of second transistor 112:

TABLE 1

Logic Table for Control Logic Circuit 118
Using Output of Current Detector 116

| CURRENT DETECTION | OUTPUT TO SECOND TRANSISTOR |
|---|---|
| YES | HIGH |
| NO | LOW |

In certain embodiments, first port 102 is further coupled to a second input of control logic circuit 118. Using Schmitt trigger 124, control logic circuit 118 may be operable to detect a voltage at the first port. Based on both the detected current from current detector 116 and the detected voltage from first port 102, control logic circuit may control the control electrode of second transistor 112. For example, control logic circuit 118 may implement the logic table in FIG. 4 to determine how to control the control electrode of second transistor 112.

As seen in the illustrated embodiment, first port 102 may be coupled to the second input of control logic circuit 118 via first Schmitt trigger 124. Similarly, second port 106 may be coupled to the control electrode of first transistor 110 via a second Schmitt trigger 126. In the illustrated embodiment, second Schmitt trigger 126 is an inverting Schmitt trigger. The disclosure, however, contemplates, that first Schmitt trigger 124 and second Schmitt trigger 126 may be an inverting Schmitt trigger, a non-inverting Schmitt trigger, a CMOS buffer, a CMOS inverter, or any other device that may alter an input waveform.

In certain embodiments, repeater 100 may receive an undervoltage-lockout signal 122. Undervoltage-lockout signal may indicate that VCCA 104 dropped below an operational value. Below a minimum supply voltage, the function and performance of the repeater may be undefined and difficult to predict system behavior. If an undervoltage lockout occurs (as may be indicated by undervoltage-lockout signal 122), a pre-charge generator may generate a current in order to compensate for the lack of current coming from current source 114. Otherwise, the system may use a power-sequence for the circuit. In certain embodiments, undervoltage-lockout signal 122 indicates that the supply signal is below an undervoltage-lockout parameter.

Device Coupled to Second Port 106 Attempting to Drive Communication Bus

In an exemplary embodiment, when the device connected to second port 106 is attempting to drive the communication bus and the device connected to first port 102 is inactive, second port 106 is at a low voltage. Because second port 106 is at a low voltage, second Schmitt trigger 126 may invert the signal to a high voltage to the control electrode of first transistor 110. Consequently, first transistor 110 pulls down first port 102. In certain embodiments, current detector 116 also detects that first port 102 is not pulling any current by detecting there is little-to-no current flowing to/from first port 102. In response to detecting a lack of current flowing to/from port 102, control logic circuit 118 controls the node of second transistor 112 such that such that second transistor 112 does not pull the communication bus for second port 106 down. Because the communication bus for second port 106 is low, second port 106 now controls the communication bus.

Device Coupled to First Port 102 Attempting to Drive Communication Bus

In another exemplary embodiment, when the device connected to first port 102 is attempting to drive the communication bus and the device connected to second port 106 is inactive, current detector 116 detects that an external device connected to first port 102 is pulling down on the bus. Because current detector 116 detects that the device connected to first port 102 is pulling down on the bus, control logic circuit 118 controls second transistor 112 such that second transistor 112 pulls the communication for second port 106 down. Now, second transistor 112 is active and first port 106 is at a low voltage. The inverting Schmitt trigger inverts the signal to a high voltage, thereby causing the first transistor 110 to pull down the communication bus further.

Because the communication bus for the first port 102 is low, first port 102 now controls the communication bus.

Figure 2:
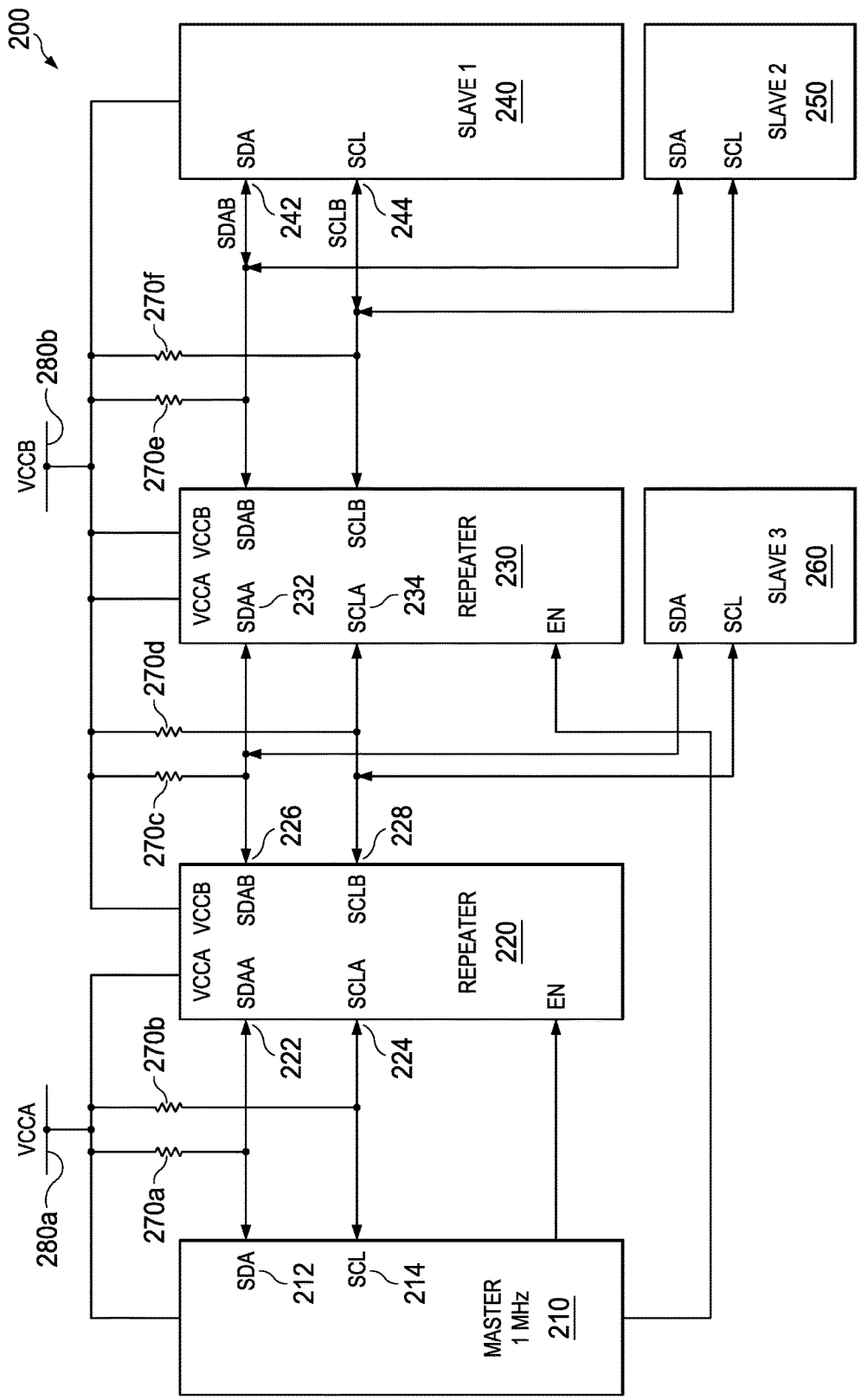
FIG. 2 is a system diagram with a master and multiple slave devices.

FIG. 2 is system 200 with a master and multiple slave devices. Communication protocols like I2C and SMBUS, and Serial Peripheral Interface (SPI) often rely on repeaters and buffers to operate large systems such as the system depicted in FIG. 2. The system diagram in FIG. 2 consists of master device 210, first repeater 220, second repeater 230, first slave device 240, second slave device 250, third slave device 260, pull-up resistors 270a-f, and power supplies Vcc 280a-b.

Master device 210 is any type of device that is able to communicate with one or more master devices, one or more slave devices, and/or one or more repeaters. While depicted as a single master device, the system diagram may contain multiple master devices 210. In certain embodiments, master device 210 is a processor. In the illustrated embodiment, master device 210 is a 1 MHz processor. Master device 210 may control a variety of elements in a system, such as an Input/Output expander, various sensors, EEPROM, ADCs/DACs, and more. Master device 210 may operate on Vcc 280a. In certain embodiments where a system may contain multiple master devices, a first master device may operate on a power supply voltage that is different than a second master device or a slave device.

Each master device, such as master device 210, may have one or more serial data lines (SDA) 212 and/or serial clock lines (SCL) 214. Typically, master device 210 drives the SCL. SDA 212 and SCL 214 are connected to Vcc 280a via pull-up resistors 270a and 270b, respectively. The size of the pull-up resistor may be determined by the amount of capacitance on the bus line. In certain embodiments, the bus is considered idle if both SDA and SCL are high. In addition, SDA and SCL are "open-drain" drivers. An "open-drain" driver is that a device can drive its output low, but the device cannot drive its output high.

Master device 210 may communicate with first repeater 220 over a communication bus using one or more protocols (e.g., I2C or SMBUS). First repeater 220 may assist in master device 210, first slave device 240, second slave device 250, and/or third slave device 260. First repeater 220 may especially be beneficial in larger or longer systems 200. First repeater 220 may support bus arbitration. For example, system 200 may use bus arbitration when multiple master devices initiate commands at the same time. In addition, first repeater 220 may be multidirectional and may not require external direction control. First repeater 220 may also offer buffer functionality, and can help in long distance signaling and multi-point applications.

First repeater 220 may have an A-side serial data line (SDAA) 222, an A-side serial clock line (SCLA) 224, a B-side serial data line (SDAB) 226, and a B-side serial clock line (SCLB) 228. SDAA 222 and SCLA 224 may be connected to the SDA and SCL of a device, such as master device 210, slave device(s), repeaters, or any other device that has an SDA and/or SCL input or output. Similarly, SDAB 226 and SCLB 228 may be connected to the SDA and SCL of a device, such as master device 210, slave device(s), repeaters, or any other device that has an SDA and/or SCL input or output. In the illustrated embodiment, SDAA 222 and SCLA 224 are connected to the SDA and SCL of master device 210, and SDAB 226 and SCLB 228 is connected to SDAA 232 and SCLA 234 of second repeater 230.

First slave device 240 may be any device that communicates with one or more master devices, one or more slave devices, and/or one or more repeaters. Typically, slave device 240 responds to master device 210. Each slave device (e.g., first slave device 240, second slave device 250, or third slave device 26) may have a specific device address to differentiate between other devices in system 200. In certain embodiments, each slave device may use a configuration upon startup to set the behavior of the device. In addition, each slave device may have one or more registers to store, write, and/or read data. Similar to master device 210, each slave device may have SDA 242 and/or SCL 244. SDA 244 and/or SCL 244 may be connected to Vcc 280a and/or Vcc 280b through one or more pull-up resistors 270a-f. Each slave device may operate on an independent power supply or a similar power supply, and the power supply voltage may be different among each slave device and/or master device.

Pull-up resistors 270a-f may represent resistors that connect each SDA and/or SCL to Vcc 280a-b. Pull-up resistors 270a-f may assist in pulling the communication bus high when a device is not driving the bus.

Power supplies Vcc 280a-b may represent one or more power rails. Power supplies Vcc 280a-b in combination with pull-up resistors 270a-f may assist in pulling the communication bus high when a device is not driving the bus.

Figure 3:
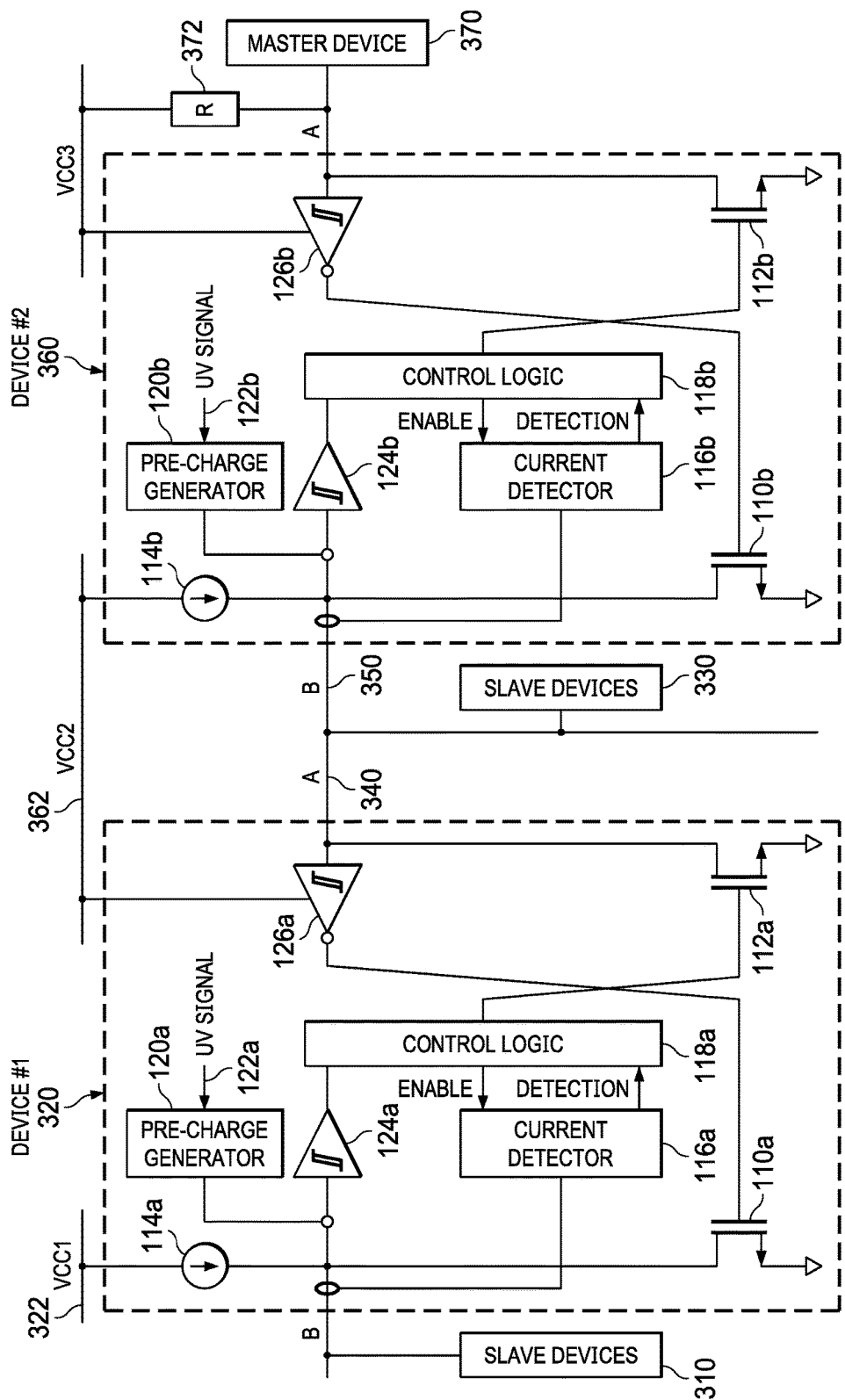
FIG. 3 is a schematic diagram of a first slave device, a first repeater, a second slave device, a second repeater, and a master device.

FIG. 3 is a schematic diagram of first slave device 310, first repeater 320, second slave device 330, second repeater 360, and master device 370. First slave device 310 is coupled to first repeater 320, first repeater 320 is coupled to second repeater 360 and second slave device 330, and second repeater 360 is coupled to master device 370.

As an example, master device 370 may communicate using SDA to second repeater 360. Second repeater 360 may repeat the signal on the SDA to second slave device 330 and first repeater 320. First repeater 320 may further repeat the original signal on the SDA to first slave device 310.

In certain embodiments, Vcc2 362 may be below an undervoltage threshold of second repeater 360. If Vcc2 362 is below an undervoltage threshold of second repeater 360, the internal current generator for second repeater 360 may no longer be functional. Because of this, false signal propagation may occur from the second repeater 360 to the first repeater because of the voltage detected at A-side point 340 by the first repeater 320. Moreover, the false propagation of the signal from the second repeater 360 to the first repeater 320 may enforce a power-sequencing requirement in system 300. Power-sequencing requirements are a set of requirements that control the power supplied to different components in a system, and typically help to prevent excessive current from drawing during startup.

To help avoid this problematic situation, second repeater 360 may comprise pre-charge generator 120b. Pre-charge generator 120b generates a pre-charge current when Vcc2 362 is below an undervoltage threshold of second repeater 360. In certain embodiments, undervoltage (UV) signal 122b notifies pre-charge generator 120b that Vcc2 362 is below the undervoltage threshold of second repeater 360. This pre-charge current defines the voltage at B-side point 350, which gives the first repeater 320 a defined input voltage 340.

Pre-charge generator 120a similarly generates a pre-charge current when Vcc1 322 is below an undervoltage threshold of second repeater 320. In certain embodiments, UV signal 122a notifies pre-charge generator 120a that Vcc1 322 is below the undervoltage threshold of first repeater 320.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction.

FIG. 4 is an exemplary binary logic table 400 for implementation in control logic circuit 118 in certain embodiments. Binary logic table 400 may contain conditions such as registering the logic level of first input 104 to determine whether to enable a pulldown of the A-side and/or a pulldown of the B-side. In certain embodiments binary logic table 400 as incorporated by control logic circuit 118 may also incorporate a current detection by current detector 116 to determine whether to enable a pulldown of the A-side and/or a pulldown of the B-side. In certain embodiments, control logic circuit 118 may incorporate second Schmitt trigger 126 in order to register the logic level of second port 106 and/or pull down of transistor 110 (i.e., B-side). In certain embodiments, detection of the logic level of second port 106 and/or pull down of transistor 110 (i.e., B-side) are performed by circuitry external to control logic circuit 118, and only logic level of B-side port column 420, current detection output B-side column 430, and enable A-side pulldown transistor column 440 are implemented in control logic circuit 118.

Binary logic table 400 may contain the following columns: logic level of A-side port column 410, logic level of B-side port column 420, current detection output B-side column 430, enable A-side pulldown transistor column 440, enable B-side pulldown transistor column 450. In certain embodiments, logic level of A-side port column 410, logic level of B-side port column 420, and current detection output B-side column 430 represent binary inputs to control logic circuit 118.

In this embodiment, the A-side transistor enable signal (controlled by the value in A-side pulldown transistor column 440) is a function of the first Schmitt trigger 124 (as indicated by the value in logic level of B-side port column 420) and the B-side current detection (as indicated by the value in current detection output B-side column 430). Also, the B-side transistor enable signal (which is not technically part of the control logic 118 in FIG. 1) is a function of second Schmitt trigger 126.

Logic level of A-side port column 410 represents the logic level at second port 106. In certain embodiments, control logic circuit 118 may incorporate second Schmitt trigger 126 and may convert the voltage at second port 106 to a binary number. For example, if the voltage at second port 106 is low, control logic circuit 118 may set the value in logic level of A-side port column 410 to '0' (or FALSE). Similarly, logic level of B-side port column 420 represents the logic level at first port 102. In certain embodiments, control logic circuit 118 may be able to determine the logic level at first port 102 based on the output of first Schmitt trigger 124. Control logic circuit 118 may convert the voltage from first Schmitt trigger 124 to a binary number representing the logic level at first port 102. For example, if voltage from first Schmitt trigger 124 is low, control logic circuit 118 may set the value in logic level of B-side port column 420 to '0' (or FALSE).

Current detection output B-side column 430 represents the current detected by current detector 116. In certain embodiments, current detector 116 may communicate a binary output to control logic circuit 118. For example, the binary output may represent a comparison between the current that flows between first port 102 and the first node (i.e., the node between the drain of first transistor 110 and current source 114) to a predetermined threshold. Alternatively, current detector 116 may detect the current flowing through first port 102, current flowing to first port 102, the binary output may represent whether current is flowing towards the first node (i.e., the node connecting current source 114 with the drain of first transistor 110), a comparison of the current in either direction, whether no current is flowing, or a comparison of the current (in one direction or either direction) against a predetermined threshold. In particular embodiments, control logic circuit 118 may convert voltage from current detector 116 to a binary number representing the current detected at the output of the B-side by current detector 116. In certain embodiments, current detector 116 may be incorporated into control logic circuit 118.

In the described embodiment, current detector 116 detects current flowing to/from the B-side (e.g., second port 106). However, current detector 116 may also detect current flowing to/from the A-side (e.g., first port 102).

Enable A-side pulldown transistor column 440 indicates in binary form whether second transistor 112 is enabled to pull down second port 106 (i.e., A-side). Similarly, enable B-side pulldown transistor column 450 indicates in binary form whether control logic circuit 118 enables first transistor 110 to pull down the first port 102 (i.e., B-side). For example, a value of "1" or ON for enable A-side pulldown transistor column 440 may instruct control logic circuit 118 to output a high voltage on the control electrode of second transistor 112, thereby turning on second transistor 112 and pulling down second port 106 accordingly. As another example and corresponding to an embodiment wherein control logic circuit 118 incorporates second Schmitt trigger 126, a value of "1" or ON for enable B-side pulldown transistor column 450 may instruct the second Schmitt trigger 126 in control logic circuit 118 to output a high voltage on the control electrode of first transistor 110, thereby turning on first transistor 110 and pulling down first port 102 accordingly.

As indicated by binary logic table 400, the combination of binary inputs from logic level of A-side port column 410, logic level of B-side port column 420, and/or current detection output B-side column 430 may result in various binary outputs control logic circuit 118 as to enable a pulldown transistor for the A-side as indicated by enable A-side pulldown transistor column 440 and/or enable a pulldown transistor for the B-side as indicated by enable B-side pulldown transistor column 450.

Figure 5:
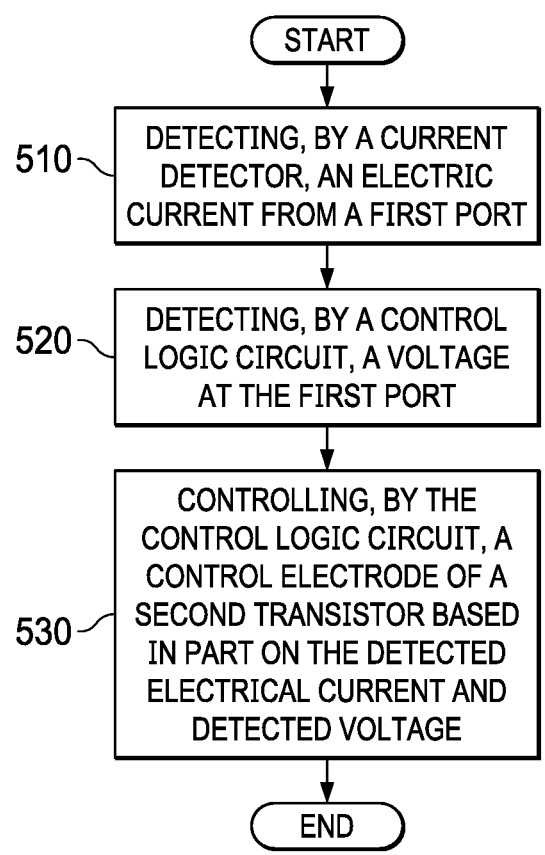
FIG. 5 illustrates an example method for repeating a signal from an A-side of a repeater to a B-side of the repeater.

FIG. 5 illustrates an example method for repeating a signal from an A-side of a repeater to a B-side of the repeater.

The method may begin at step 510, where current detector 116 detects an electric current from first port 102. In certain embodiments, current detector 116 is able to determine how much current is flowing out of first port 102. Current detector 116 may detect the current flowing through first port 102, current flowing to first port 102, current flowing towards the first node (i.e., the node connecting current source 114 with the drain of first transistor 110), a comparison of the current in either direction, no current, or a comparison of the current (in one direction or either direction) against a predetermined threshold. By detecting the current between first port 102 and first node, the repeater may be able to determine whether any devices at first port 102 or second port 106 are in control of the communication bus and may be communicating information.

At step 520, control logic circuit 118 detects a voltage at first port 102. In certain embodiments, control logic circuit 118 detects a voltage at first port 102 via first Schmitt trigger 124.

At step 530, control logic circuit 118 controls a control electrode of second transistor 112 based in part on the detected voltage and detected electric current from first port 102. For example, control logic circuit 118 may implement the logic table in FIG. 4 to determine how to control the control electrode of second transistor 112.

Particular embodiments may repeat one or more steps of the method of FIG. 5, where appropriate. Although this disclosure describes and illustrates particular steps of the method of FIG. 5 as occurring in a particular order, this disclosure contemplates any suitable steps of the method of FIG. 5 occurring in any suitable order. Moreover, although this disclosure describes and illustrates an example method for repeating a signal from an A-side of a repeater to a B-side of the repeater including the particular steps of the method of FIG. 5, this disclosure contemplates any suitable method for repeating a signal from an A-side of a repeater to a B-side of the repeater including any suitable steps, which may include all, some, or none of the steps of the method of FIG. 5, where appropriate. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. An apparatus, comprising:
   a first port;
   a second port;
   a first transistor comprising:
      a first transistor channel electrode coupled to the first port; and a first transistor control electrode;
a second transistor comprising:
  a second transistor control electrode; and
  a second transistor channel electrode coupled to the second port;
a current source coupled to the first port;
a current detector comprising:
  a current detector input coupled to the first port, the current source, and the first transistor channel electrode; and
  a current detector output;
a control logic circuit comprising:
  a control logic circuit input coupled to the current detector output; and
  a control logic circuit output coupled to the second transistor control electrode.

2. An apparatus comprising:
a first port;
a second port;
a current detector comprising:
  a current detector input coupled to the first port; and
  a current detector output;
a transistor comprising:
  a transistor channel electrode coupled to the second port; and
  a transistor control electrode; and
a control logic circuit comprising:
  a control logic circuit input coupled the current detector output; and
  a control logic circuit output coupled to the transistor control electrode; and
a pre-charge current generator coupled to the first port and the current detector.

3. The apparatus of claim 2, further comprising a first transistor comprising a first transistor channel electrode; and wherein:
  the transistor is a second transistor; and
  the first port is further coupled to the first transistor channel electrode.

4. The apparatus of claim 3, further comprising:
  a first power supply coupled to a current generator and having a first power supply voltage;
  a second power supply coupled between the transistor control electrode and the second port and having a second power supply voltage, wherein the first power supply voltage is a different voltage than the second power supply voltage.

5. The apparatus of claim 3, further comprising a current source coupled to the first port and the current detector input.

6. The apparatus of claim 5, wherein:
  the current source is coupled to the first transistor at a first node; and
  the current detector is coupled to a current path that is formed between the first port and the first node.

7. The apparatus of claim 5, wherein the current source comprises a variable current source.

8. The apparatus of claim 2, wherein the control logic circuit is operable to control the control electrode of the transistor based in part on the output of the current detector.

9. The apparatus of claim 2, wherein:
  the control logic circuit further comprises a control logic circuit second input;
  the first port is further coupled to the control logic circuit second input; and
  the control logic circuit is operable to control the control electrode of the transistor based in part on the current detector output and a detected voltage at the first port.

10. The apparatus of claim 2, wherein:
  the first port is further coupled to a first device; and
  the second port is further coupled to a repeater.

11. The apparatus of claim 2, wherein said control logic circuit comprises Boolean circuits.

12. The apparatus of claim 2, wherein the first port receives a communication at a frequency above 100 kHz.

* * * * *